United States Patent [19]

Szerlip et al.

[11] Patent Number: 5,504,993

[45] Date of Patent: Apr. 9, 1996

[54] METHOD OF FABRICATING A PRINTED CIRCUIT BOARD POWER CORE USING POWDERED CERAMIC MATERIALS IN ORGANIC BINDERS

[75] Inventors: Stanley R. Szerlip, Longmont; Floyd G. Paurus, Boulder; Frances Planinsek, Louisville; Robert D. Stroud, Boulder, all of Colo.

[73] Assignee: Storage Technology Corporation, Louisville, Colo.

[21] Appl. No.: 297,799

[22] Filed: Aug. 30, 1994

[51] Int. Cl.⁶ ................................ H05K 3/10; H05K 1/03
[52] U.S. Cl. .................. 29/849; 29/851; 174/258; 174/259; 428/901
[58] Field of Search ................ 29/846–852; 174/257, 174/258, 259; 427/96, 177, 178; 428/901, 565; 264/61, 62, 319

[56] References Cited

U.S. PATENT DOCUMENTS

| | | | |
|---|---|---|---|
| 4,107,837 | 8/1978 | Chang | 29/852 |
| 4,145,460 | 3/1979 | Finley et al. | 29/847 X |
| 4,403,107 | 9/1983 | Hoffman | 29/849 X |
| 4,490,429 | 12/1984 | Tosaki et al. | 428/901 X |
| 4,943,516 | 7/1990 | Kamayachi et al. | 427/177 X |
| 5,262,595 | 11/1993 | Yano et al. | 174/258 |

FOREIGN PATENT DOCUMENTS

| | | | |
|---|---|---|---|
| 46398 | 4/1979 | Japan | 29/849 |
| 49297 | 2/1989 | Japan | 29/849 |

*Primary Examiner*—Peter Vo
*Attorney, Agent, or Firm*—Duft, Graziano & Forest

[57] ABSTRACT

A method of fabricating a printed circuit board power core is disclosed wherein ceramic particles that have a diameter that is approximately equal to the desired dielectric thickness are combined with dielectric powders that have a relatively very small size. To produce a dielectric core using this technique, a dielectric material mixture is applied between two conductor layers and bonded therebetween. This dielectric material mixture preferably has a concentration of large particles equal to the desired core thickness with a loading factor of large/small particles less than the maximum ratio needed to provide the desired dielectric constant, but greater than the ratio required to provide stability during the pressing and curing steps.

26 Claims, 4 Drawing Sheets

5,504,993

METHOD OF FABRICATING A PRINTED CIRCUIT BOARD POWER CORE USING POWDERED CERAMIC MATERIALS IN ORGANIC BINDERS

FIELD OF THE INVENTION

This invention relates generally to printed circuit boards, and more specifically to methods for fabricating a primed circuit board having a high capacitance core which is used as a decoupling capacitor for integrated circuits installed on the printed circuit board.

PROBLEM

As presently constructed, typical printed circuit boards consist of multiple layers of composites of organic and inorganic materials, with internal and external wiring, allowing electrical components to be mechanically supported and electrically connected. The technology trend in printed circuit board manufacturing has been towards increasing numbers of interconnect layers, greater pass-through hole densities (permitted by smaller hole diameters), and finer line (trace) widths. The goal of this trend is to allow greater numbers of components to be installed on a printed circuit board of a given size.

Throughout this evolution in printed circuit board technology, however, little progress has been made with respect to building active or passive electronic devices as integrated elements during the multilayer printed circuit board manufacturing process. This lack of progress is due to numerous problems associated with such integration. Printed circuit board manufacturing processes and circuit manufacturing processes are so basically incompatible in their required cleanliness, thermal cycle, photolithography and other requirements, that few process similarities exist in their respective methods of fabrication.

The state of the electronic art is such that, for a typical printed circuit board assembly having a large number of integrated circuits, a correspondingly large number of decoupling capacitors is typically required. These decoupling capacitors are required to provide for instantaneous current requirements of the integrated circuits, and to reduce system noise. Such capacitors occupy considerable printed circuit board surface space, require extra assembly (insertion) time, and increase the overall cost of a completed primed circuit board unit. In addition to the per-capacitor cost, each capacitor also constitutes a potential point of failure that reduces inherent system reliability.

Although present printed circuit boards often contain a "dielectric core" located between a power plane and a ground plane, the material used in the dielectric core is typically ordinary glass fiber pre-preg (e.g., fiberglass cloth and a fire retardant epoxy resin). Cores using fiberglass as the dielectric material typically exhibit capacitances of 200 picofarads per square inch, which may marginally reduce system noise. However, this capacitance-to-area ratio is not sufficient to satisfy the inrush current requirements of most integrated circuits, and as a result, further decoupling (in the form of externally mounted capacitors) is required.

Conventional printed circuit board capacitive cores rely on the thickness of a cloth or :fabric material such as fiberglass to provide the spacing between the plates of the capacitor core. In conventional printed circuit board fabrication, the fabric core material is saturated with an appropriate epoxy material to form what is called a "pre-preg". The fabric core material is layered so that the number of layers and the thickness of the individual layers determine the overall thickness of the basic core. The pre-preg material is then bonded between a pair of copper conductor layers to create capacitive core. One problem with this conventional printed circuit board fabrication technique is that cumulative irregularities in the fabric thickness may result in a core having an uneven thickness.

In a printed circuit board core made from high dielectric constant material, the overall capacitance of the core is a function of the area of the plates surrounding the core and is inversely proportional to the separation of the plates. Since the area of a given printed circuit board is typically fixed by the design of the circuit, there is little that can be done to increase the power core area unless multiple power core layers are sandwiched together in a stack to provide an n-fold (where n is the number of layers) increase in the power core area with respect to the circuit board area. This results in an expensive process for fabricating a high capacitance power core. Other methods of increasing the capacitance of a printed circuit board power core might include decreasing the distance between the plates and/or increasing the dielectric constant of the core material. These methods are limited by physical and electrical constraints which include the difficulty of manufacturing extremely thin fabric materials and the fact that these fabric materials adversely affect the resultant core dielectric constant.

In addition to the fact that a thin core provides higher capacitance, a thin core is also desired to minimize the overall thickness of the completed printed circuit board assembly (which is often called as a printed wiring assembly or PWA). U.S. Pat. No. 5,010,641 describes a method of decreasing the power core thickness which improves the capacitance of the core somewhat. However, the '641 patent discloses the use of "epoxy glass" dielectric, which has a relatively low dielectric constant in comparison to the dielectric material taught in U.S. Pat. No. 5,162,977, assigned to Storage Technology Corp.

A high capacitance printed circuit board core can be realized by using the techniques taught in the '977 patent by increasing the dielectric constant significantly over dielectric constants previously attainable with organic binder/fiberglass cloth methods used to fabricate conventional printed circuit boards. A significant problem exists, however, in providing a method of manufacture that will achieve a suitably thin structure utilizing the materials described in the '977 patent.

As is well known, the dielectric value of a capacitive medium is significantly reduced by the inclusion of any material having a low dielectric constant. It is therefore desirable to keep the amount of low dielectric constant material to a minimum when fabricating a high dielectric constant core. Since typical fabric materials have a relatively low dielectric constant, the use of fabric as the thickness determining material should be avoided when a very high dielectric constant core is required.

SOLUTION

The above problems are solved, and a technical advance achieved in the field of printed circuit board power core fabrication by the methods described in the present invention. All of these methods eliminate the use of fabric materials which significantly reduce the resultant dielectric constant of the power core.

Essential to each of the printed circuit board fabrication methods disclosed in this document is the combining of ceramic particles that have a diameter that is approximately equal to the desired dielectric thickness with dielectric powders that have a relatively very small size. To produce a dielectric core using this technique, a dielectric material mixture is applied between two conductor layers and bonded therebetween. This dielectric material mixture preferably has a concentration of large particles equal to the desired core thickness with a loading factor of large/small particles less than the maximum ratio needed to provide the desired dielectric constant, but greater than the ratio required to provide stability during the pressing and curing steps.

In order to fabricate a printed circuit board with a high dielectric constant core in accordance with the present method, a liquid or plastic epoxy binding with a concentration of dielectric powder is applied to an electrically conductive plate ("conductor plate") such that the film thickness, when dried or latent B-staged, is either one-half the thickness of the desired core thickness or the full core thickness. In the first case, a second partial core is fabricated to a one-half core thickness, and the two one-half thick cores are bonded and cured. In the second case, the full thickness core may be directly bonded to one of the conductor plates. The application of the dielectric material to the conductor plate(s) may be accomplished by a number of techniques, such as:

1. Spraying an epoxy/dielectric film in such a manner that the film coats the conductor plate and remains in place until the solvents in the epoxy material dissipate.
2. Applying an epoxy/dielectric paste to the conductor plate using a straight-edged blade mechanism ("doctor blade") to apply a predefined thickness of paste.
3. Applying a dried powder comprising atomized ceramic and epoxy materials using a doctor blade mechanism to obtain a predefined thickness of core material. This material is then pressed onto the conductor plate using pressure and/or heat in such a manner as to obtain a secondary attached uncured dielectric film on the conductor plate.
4. Applying an epoxy/dielectric paste, using a silkscreen as the thickness determining medium. The thickness of the silkscreen is chosen to be somewhat thicker than the desired core member thickness by a defined thickness differential that compensates for the silkscreen material and that of the epoxy material removed when the silkscreen is removed from the conductor plate.
5. Applying an epoxy/ceramic dielectric paste to the conductor plate using a roller system where the thickness of the uncured dielectric mixture is controlled by the viscosity of the dielectric paste. Alternatively, the paste is applied with a roller system and bladed to the final desired uncured thickness.

BRIEF DESCRIPTION OF THE DRAWING

The invention may be better understood from a reading of the following description thereof taken in conjunction with the drawing in which.

DETAILED DESCRIPTION OF THE INVENTION

Figure 1:
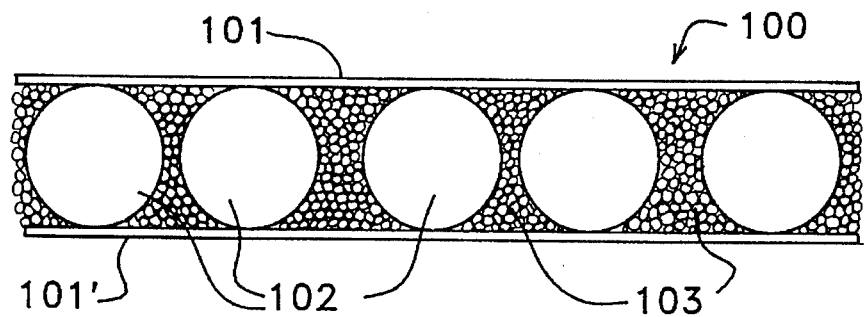
FIG. 1 illustrates a cross-section of a dielectric core according to the present method which uses thickness-determining ceramic particles with a ceramic nanopowder/epoxy filler.

The present invention discloses a number of related methods which eliminate the use of fabric or other woven materials in the construction of a high dielectric constant printed circuit board power core. These methods significantly increase the resultant dielectric constant of the capacitive power core:

In a high dielectric constant printed circuit board capacitative power core such as that disclosed in U.S. Pat. No. 5,162,977 (Paurus, et al.), the overall capacitance of the core is determined by the area of the plates surrounding the core, the dielectric constant of the core material, and the separation of the plates.

The effective capacitance for closely placed parallel plates is given by the equation $C=(es/1)$, where e is the permitivity of the dielectric in coulombs$^2$, the capacitance C is expressed in farads, the area s of the plates is expressed in meters, the distance between the parallel plates is 1.

As is well known, the composite value of the dielectric of a capacitive core comprised of materials having different dielectric constants can be obtained by finding the anti-log of the following equation:

$$\log e_r = (p_1(\log e_1) + p_2(\log e_2) + \ldots + p_n(\log e_n))$$

Where:

$e_r$=resultant dielectric constant, $e_1 \ldots e_n$=dielectric constants of the materials, and $p_1 \ldots p_n$=respective percentage of the material.

From this relationship it can be seen that it is desirable to keep the percentage of low dielectric constant materials to a minimum when fabricating a high dielectric constant core. Therefore, it is preferable not to use fabric material as the thickness determining material when very high dielectric constants are required, because of the inherently low dielectric constant of typical fabric materials. The high dielectric constant material may, for example, have a dielectric constant greater than 50.

Principle of the Invention

An essential aspect of the present method is the combination of relatively large (e.g., ceramic) particles with a high-dielectric constant nanopowder material comprising an organic binder and dielectric particles having a significantly smaller diameter than the large ceramic particles. In an exemplary embodiment, the ratio of the diameter of the large particles to the small particles is approximately 3:1 or more, and the volume of the small particles is about 50% or more greater than that of the large particles. The diameter of the large particles determines the thickness of the dielectric layer of the resulting capacitive core. Therefore, the large particles should have a diameter as large, or nearly as large as the desired core thickness. The ceramic particles may have the same composition as the "high-dielectric constant material", or may have a different composition with a high dielectric constant and temperature characteristics that differ from the "high dielectric constant material". It is nevertheless preferable that the ceramic particles have a high dielectric constant.

The ceramic/dielectric particle mixture preferably has a bi-modal particle size distribution, i.e., wherein all the large particles have essentially the same diameter, and all the small particles have essentially the same diameter, as described above. However, other particle size distributions can be employed with the present method to produce a power core having a high dielectric constant. For example, the particle size distribution could be a partial tail Gaussian distribution whereby the plate thickness is determined by the maximum size particle of the distribution and all the other particles are smaller than that size.

The combination of ceramic thickness-determining particles and a relatively finer ceramic nanopowder dielectric particle/binder mixture provides a resultant high-dielectric constant printed circuit board core whose thickness is determined primarily by the diameter of the larger ceramic particles.

As described below with respect to FIGS. 2–8, an epoxy binder and dielectric powder are combined with ceramic particles that have a diameter that is approximately equal to the desired dielectric thickness to form a high dielectric constant powder, paste, or sprayable liquid. This high dielectric constant material is then applied to an electrically conductive plate ("conductor plate") which is typically either an unrolled copper foil strip or a pre-cut section thereof. It is assumed that the ceramic particles are essentially spherical, in which case the desired concentration of large particles with respect to the epoxy binder/dielectric powder which fills the inter-particle space is approximately 39.75 percent. To produce a dielectric core using this technique, the high-dielectric constant material mixture is applied between two conductor layers and bonded therebetween.

The dielectric material mixture preferably has a concentration of large particles equal to the desired core thickness with a loading factor of large/small particles less than the maximum ratio needed to provide the desired dielectric constant, but larger than the ratio required to provide stability during the pressing and curing steps. The large particles must be capable of supporting the pressure needed to bond the conductor core material. The dielectric powder which comprises the main dielectric component of the epoxy/dielectric mixture can be any one of the high-dielectric constant ceramic nanopowders or other nanopowders of the same class of materials disclosed in the '977 patent discussed above.

Dielectric Material Application Techniques

FIG. 1 illustrates a cross-section of a dielectric printed circuit board (PCB) core 100 in accordance with the present method which uses relatively large ceramic particles 102 in combination with a ceramic nanopowder/epoxy filler 103 having relatively small ceramic particles to create a high-capacitance dielectric core. This mixture of large and small ceramic particles provides a PCB core which has an extremely high dielectric constant relative to the volume of the core.

In accordance with the present method, a dielectric material is applied to an electrically conductive plate 101 or 101' ("conductor plate") to form a dielectric layer comprising an organic (epoxy) binder with a concentration of dielectric powder such that the film thickness, when dried or B-staged, is either one-half the thickness of the desired core or the full core thickness. In the first case, a second partial core is fabricated to a one-half core thickness, and the two one-half thick cores are bonded and cured. In the second case, the full thickness core may be directly bonded to one of the conductor plates. In one exemplary embodiment, the thickness of the cured dielectric layer is approximately 2 mils (0.002 inches).

All of the techniques for application of dielectric material to conductor plates disclosed in this document use this large particle-epoxy/nanopowder mixture. Methods of applying this type of dielectric material to conductor plates to form a dielectric PCB core include, but are not limited to the following techniques.

Spray Application of Liquid Film

Figure 2:
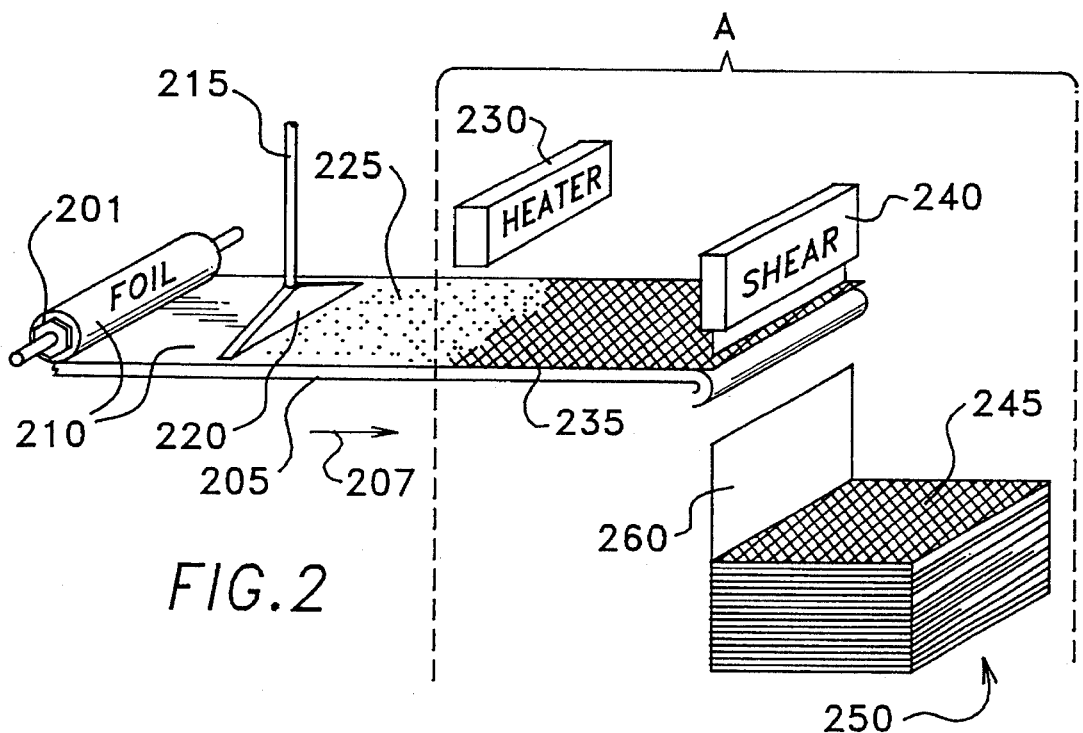
FIG. 2 illustrates application of a dielectric material to a conductor plate by spraying an epoxy/dielectric liquid onto a length of copper foil.

FIG. 2 illustrates application of a dielectric material to a conductor plate by spraying an epoxy/dielectric liquid film or slurry onto a length of copper foil. As shown in FIG. 2, copper foil 210 is unrolled from roll 201 and travels down conveyor 205 in direction 207. An epoxy/dielectric liquid film or slurry flows through conduit 215 and is applied by spray head 220 onto copper foil 210 in such a manner that a film 225 is deposited on the foil. Film 225 is either dried by heater 230 or remains in place a sufficient time until the solvents in the epoxy material dissipate or evaporate to form a dried or latent curing dielectric layer 235 on foil 210. The thickness of the layer of dried film is determined by the diameter of the large particles 102 in the large particle-epoxy/nanopowder mixture.

When the latent curing dielectric layer/copper foil 235/210 reaches the end of conveyor 205, shear 240 cuts off an appropriate length of the foil to form a panel 245 which is deposited into a stack 250 in bin 260. The heater/shear/bin apparatus 230/240/260 as delineated by bracket "A" is also used with the methods shown in FIGS. 4 through 6, but is not shown in those Figures for the purpose of simplification.

Figure 3:
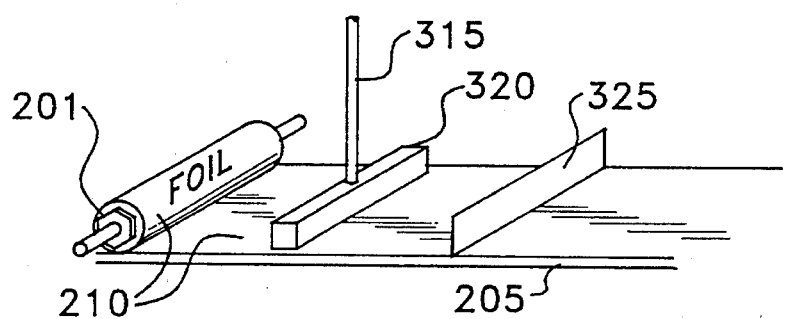
FIG. 3 illustrates application of a dielectric material to a conductor plate by applying a epoxy/dielectric paste to the conductor plate using a straight-edged blade mechanism.

FIG. 3 illustrates application of a dielectric material to a conductor plate by applying an epoxy/dielectric paste to the foil conductor plate 210 using a straight-edged blade mechanism (a "doctor-blade") 325 to effect a predefined thickness of paste. The paste is supplied through conduit 315 and is applied by spray head 320 onto copper foil 210 in such a manner that a film is deposited on the foil. The film is then dried and stored for further processing as described with respect to bracket "A" shown in FIG. 2.

Figure 4:
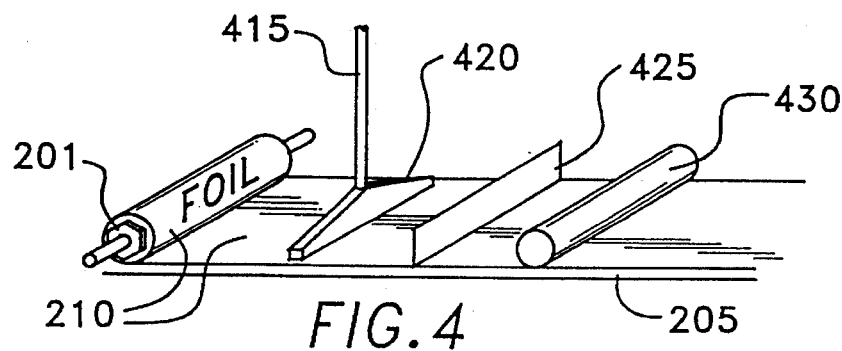
FIG. 4 illustrates application of a dielectric material to a conductor plate by applying a dried powder comprising atomized ceramic and epoxy materials using a blade mechanism.

FIG. 4 illustrates application of a dielectric material to a foil conductor plate 210 by applying a dried powder comprising atomized ceramic and epoxy materials using a "doctor blade" mechanism 425 to obtain a pre-defined thickness of dielectric core material. This core material is them pressed onto the foil 210 using pressure from roller 430 in such a manner as to obtain a secondary attached latent curing dielectric film on the conductor plate. Roller 430 is heated to compress the dielectric material. The powder should be heated to flow and compressed into a film. The heating temperature should be less than the latent curing activation temperature. The conductor/film material is then cut and stored for further processing, as shown in bracket "A" of FIG. 2.

Figure 5:
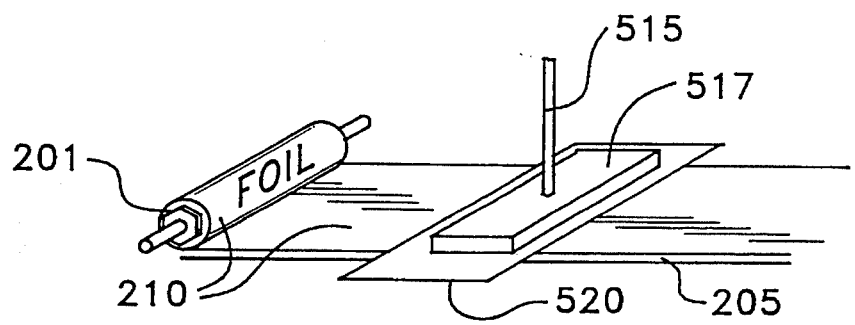
FIG. 5 illustrates application of a dielectric material to a conductor plate by applying an epoxy/dielectric paste using a silkscreen as the thickness determining medium.

FIG. 5 illustrates application of a dielectric material to a conductor plate by applying a epoxy/dielectric paste, using a silkscreen as the thickness determining medium. The epoxy/dielectric paste is applied by applicator 517, using a silkscreen 520 as the thickness determining medium. The thickness of the silkscreen 520 is chosen to be somewhat thicker than the desired core member thickness by a defined thickness differential that compensates for the silkscreen material and that of the epoxy material removed when the silkscreen is removed from the foil 210. In the case where a paste is used, it is desirable that the solvent content be such that the paste can flow after the silkscreen is removed.

Figure 6:
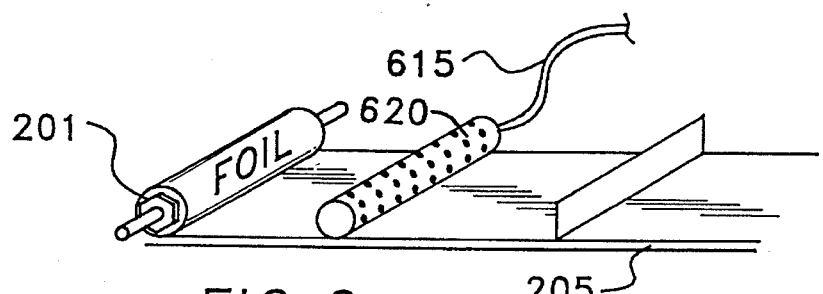
FIG. 6 illustrates application of a dielectric material to a conductor plate by applying an epoxy/ceramic dielectric paste mixture to the conductor plate using a pressurized roller system where the thickness of the uncured dielectric mixture is controlled by the viscosity of the paste.

FIG. 6 illustrates application of a dielectric material to a conductor plate by applying an epoxy/ceramic dielectric paste mixture to copper foil 210 using a roller 620 having a plurality of holes through which a pressurized dielectric mixture is fed by conduit 615. In this embodiment, the thickness of the uncured dielectric mixture is controlled by the viscosity of the dielectric paste. Alternatively, the paste is applied with a roller system and bladed to the final desired uncured thickness, as described with respect to FIGS. 3 or 4.

Figure 7:
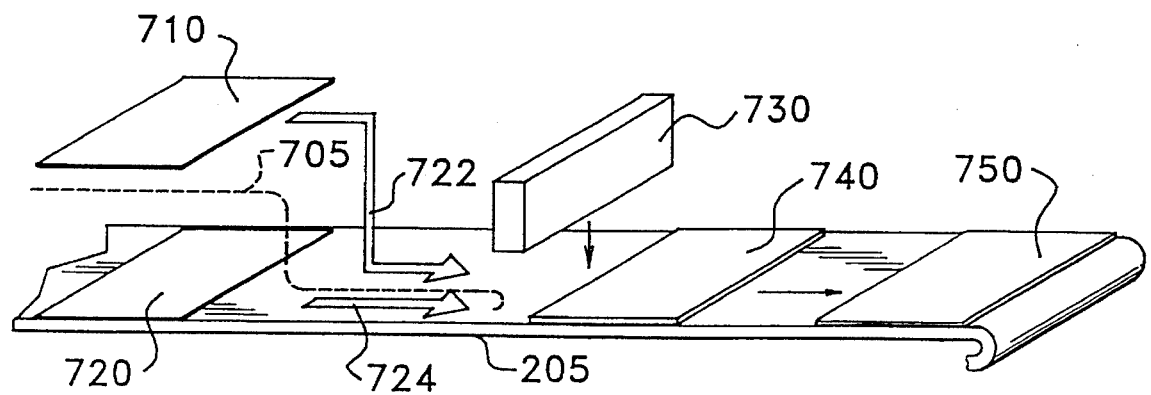
FIG. 7 illustrates one alternative of the final stage of the dielectric/conductor plate bonding process wherein the dielectric thickness of each conductor plate is 1/2 the desired final dielectric thickness.

FIG. 7 illustrates one alternative in the final stage of the dielectric/conductor plate bonding process wherein the dielectric thickness of each conductor plate is ½ the desired final dielectric thickness. In this embodiment, copper foil panels 710 and 720 are one-half thickness panels coated on their bottom side and top side, respectively, and are identical to panels 245 shown in FIG. 2. An upper conveyer mechanism (shown in dotted lines for purposes of clarity) 705 and a lower conveyor mechanism 205 move panels 710 and 720 in directions 722 and 724, respectively, to position the panels under panel alignment and pressing mechanism 730, where they are pressed and bonded to form a dielectric "sandwich" 740. The panels are then cured to form the resulting full-thickness dielectric core 750. In this embodiment, each of the "panels" may in fact be a continuous foil strip which is cut into appropriate lengths after being bonded. Alternatively, pressing mechanism 730 may be a high pressure roller (heated or unheated) which applies a pressure of approximately 20,000 PSI or more to panels 710/720.

Figure 8:
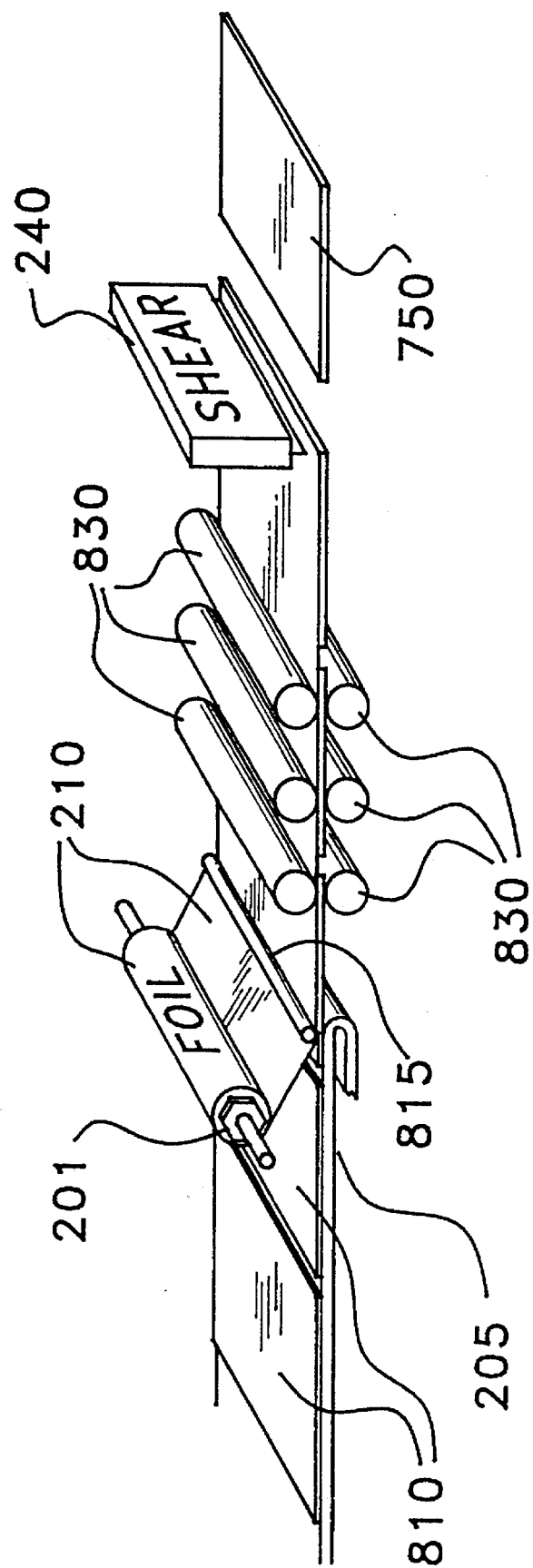
FIG. 8 illustrates another alternative of the final stage of the dielectric/panel bonding process wherein the dielectric thickness on one of the conductor plates is equal to the desired final dielectric thickness.

FIG. 8 illustrates another alternative of the final stage of the dielectric/panel bonding process wherein the dielectric thickness on one of the conductor plates is equal to the desired final dielectric thickness. In this embodiment, a series of copper foil panels 810 are first coated on their top surface with dielectric material having the full desired thickness. These panels 810 travel along conveyer 205 to roller 815 where an uncoated layer of copper foil 210 is mated to the dielectric layer. Heated rollers 830 then press and bond the foil 210 to the panels 810. After being bonded, the panels 810 are then cut to the appropriate length by shear 240 to produce dielectric core 750. Rollers 830 may be high pressure, heated or unheated rollers which apply a pressure of about 20,000 PSI or more to panels 810.

Figure 9:
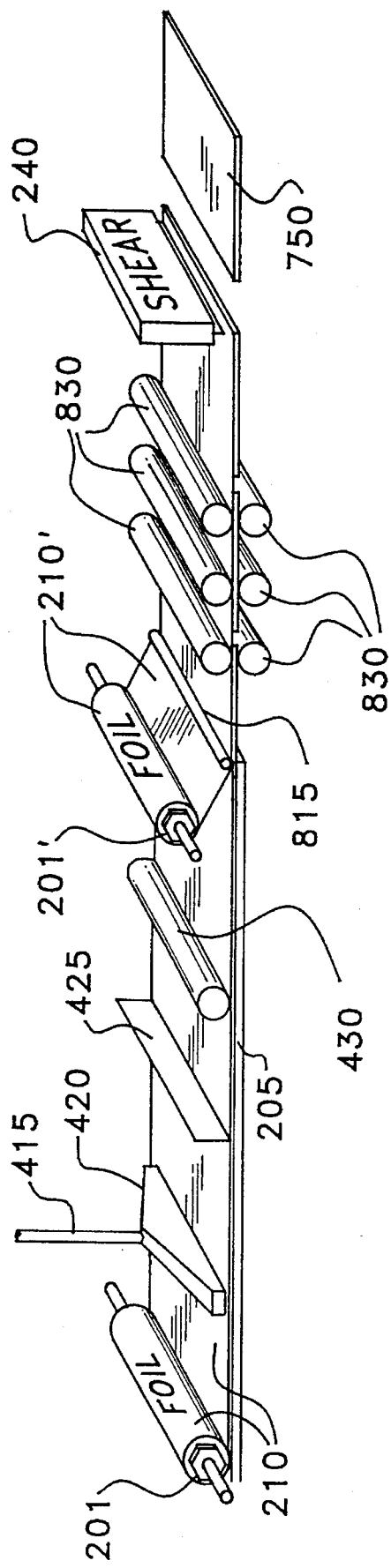
FIG. 9 illustrates an embodiment similar to that of FIG. 8, wherein the bottom conductive layer comprises foil which has been coated with a doctor-bladed dielectric material which is later dried to provide a latent curing film.

FIG. 9 illustrates an embodiment similar to that of FIG. 8, wherein the bottom conductive layer comprises foil 210 which has been coated with a doctor-bladed dielectric material prior to the application of top foil 210', as shown in FIG. 4. In this embodiment, sufficient time must elapse for solvents in the dielectric material deposited on foil 210 to evaporate before top foil 210' is applied. The resultant dielectric core 750 is equivalent to dielectric core 750 shown in FIGS. 7 and 8.

Figure 10:
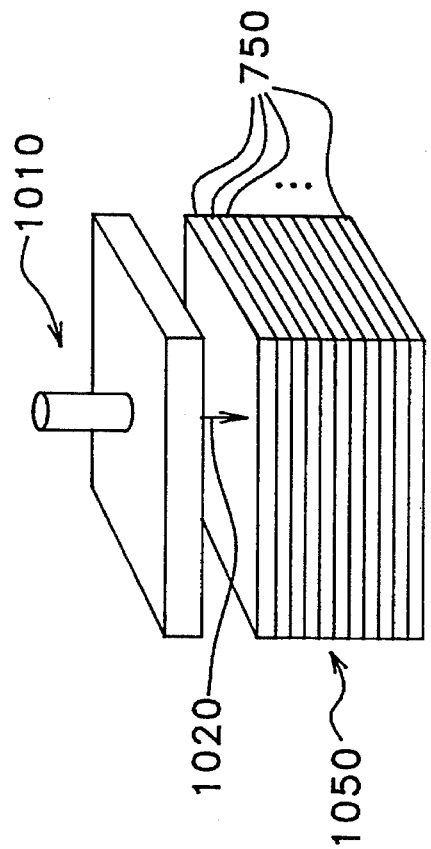
FIG. 10 illustrates a final pressing operation wherein multiple dielectric cores are stacked and pressed at relatively low pressure.

FIG. 10 illustrates a final pressing operation wherein multiple dielectric cores 750 are pressed at relatively low pressure after being sheared and stacked in stack 1050. When each dielectric core 750 reaches the end of the conveyor belt 205 (as shown in FIGS. 2–9), the latent cured epoxy binder is typically not fully cured. Therefore, in order to ensure that neither the top nor the bottom conductive layers of an otherwise completely fabricated dielectric core do not shift or become misaligned, a stack 1050 of cores 750 is placed under a press 1010 which applies a low pressure of about 200 PSI to the cores 750 until a final cure is obtained. The same low-pressure pressing operation is also applicable to dielectric cores which are fabricated by the methods shown in FIGS. 2–6 and 8–9.

It is to be expressly understood that the claimed invention is not to be limited to the description of the preferred embodiment but encompasses other modifications and alterations within the scope and spirit of the inventive concept.

We claim:

1. A method of fabricating a high dielectric constant power core having a desired thickness of dielectric material for use in printed circuit boards, said method comprising the steps of:

selecting a first quantity of high dielectric constant particles having a first diameter that is approximately as large as the desired thickness of the dielectric material;

selecting a second quantity of high dielectric constant particles having a second diameter that is significantly smaller than said first diameter;

combining said first quantity and said second quantity together an organic binder to form a dielectric particle mixture;

applying the dielectric particle mixture to a first conductive plate to form a dielectric layer having a thickness approximately equal to said desired thickness;

bonding the dielectric particle mixture to a surface of said first conductive plate; and bonding a second conductive plate to an outer surface of said dielectric layer to yield said power core.

2. The method of claim 1, wherein said second quantity is greater than about 150% of the volume of said first quantity.

3. The method of claim 1, wherein said first diameter is greater than about three times said second diameter.

4. The method of claim 1, wherein each of the steps of bonding is accomplished by heating the dielectric particle mixture sufficiently to cure the organic binder contained therein.

5. The method of claim 1, wherein each of the steps of bonding is accomplished by applying pressure to said dielectric particle mixture.

6. The method of claim 5, wherein said pressure is greater than about 20,000 PSI.

7. The method of claim 1, wherein each of the steps of bonding is accomplished by applying heat and pressure to said dielectric particle mixture.

8. The method of claim 7, wherein said pressure is greater than about 20,000 PSI.

9. The method of claim 1, wherein said first diameter and said second diameter of said high dielectric constant particles in said dielectric particle mixture have a bi-modal distribution.

10. The method of claim 1, wherein said first diameter and said second diameter of said high dielectric constant particles in said dielectric particle mixture vary approximately in accordance with a Gaussian distribution.

11. A method of fabricating a high dielectric constant power core having a desired thickness of dielectric material for use in printed circuit boards, said method comprising the steps of:

selecting a first quantity of high dielectric constant particles having a first diameter that is at least as large as the desired thickness of the dielectric material;

selecting a second quantity of high dielectric constant particles having a second diameter that is significantly smaller than said first diameter;

combining said first quantity and said second quantity with an organic binder to form a dielectric particle mixture;

applying the dielectric particle mixture to a surface of a first conductive plate to form a first dielectric layer having a thickness approximately equal to one-half of said desired thickness;

applying the dielectric particle mixture to a surface of a second conductive plate to form a second dielectric layer having a thickness approximately equal to one-half of said desired thickness;

bonding the dielectric particle mixture to said first conductive plate and to said second conductive plate; and bonding said first conductive plate and said second conductive plate together so that said first dielectric layer and said second dielectric layer are in parallel contact to yield said power core.

12. The method of claim 11, wherein said second quantity is greater than about 150% of the volume of said first quantity.

13. The method of claim 11, wherein said first diameter is greater than about three times said second diameter.

14. The method of claim 11, wherein each of the steps of bonding is accomplished by heating the dielectric particle mixture sufficiently to cure the organic binder contained therein.

15. The method of claim 11, wherein each of the steps of bonding is accomplished by applying pressure to said dielectric particle mixture.

16. The method of claim 15, wherein said pressure is greater than about 20,000 PSI.

17. The method of claim 11, wherein each of the steps of bonding is accomplished by applying heat and pressure to said dielectric particle mixture.

18. The method of claim 17, wherein said pressure is greater than about 20,000 PSI.

19. A method of fabricating a high dielectric constant power core having a desired thickness of dielectric material for use in printed circuit boards, said method comprising the steps of:

applying a high dielectric constant material directly to a first conductive plate to form a dielectric layer of said desired thickness having a first surface in contact with said first conductive plate, said desired thickness being defined by particles of said dielectric constant material having a diameter equal to said desired thickness;

bonding said first surface of said dielectric layer to said first conductive plate; and bonding a second surface of said dielectric layer to a second conductive plate in order to yield said power core.

20. The method of claim 19, wherein said high dielectric constant material comprises an epoxy binder material having solvent mixed therein, and wherein the step of applying comprises:

spraying a film of said high dielectric constant material onto said first conductive plate so that the film coats the first conductive plate; and allowing said solvent in the epoxy binder material to evaporate.

21. The method of claim 19, wherein said high dielectric constant material comprises an epoxy/dielectric paste, and the step of applying comprises:

applying said epoxy/dielectric paste to said first conductive plate using blade means to apply a thickness of said paste approximately equal to said desired thickness of dielectric material.

22. The method of claim 19, wherein the step of applying comprises:

applying a dried powder comprising atomized ceramic and epoxy materials using blade means to obtain a pre-defined thickness of core material; and pressing said core material onto the conductive plate using pressure and heat to obtain a secondary attached uncured latent B-staged dielectric film on the conductor plate.

23. The method of claim 19, wherein the step of applying includes:

using a silkscreen as a dielectric material thickness determining medium, wherein the silkscreen has a thickness which is slightly greater than the desired thickness of said dielectric material.

24. The method of claim 19, wherein the step of applying comprises:

applying an epoxy/ceramic dielectric paste mixture to the conductive plate using a roller system whereby the thickness of the uncured dielectric mixture is controlled by the viscosity of the dielectric paste mixture.

25. The method of claim 24, wherein the paste is applied with a roller system and bladed to an uncured desired thickness.

26. A method of fabricating a high dielectric constant power core having a desired thickness of dielectric material for use in printed circuit boards, said method comprising the steps of:

applying a high dielectric constant material devoid of fabric directly to a first conductive plate to form a dielectric layer of said desired thickness having a first surface in contact with said first conductive plate, said desired thickness being defined by particles of said dielectric constant material having a diameter equal to said desired thickness;

bonding said first surface of said dielectric layer to said first conductive plate; and bonding a second surface of said dielectric layer to a second conductive plate in order to yield said power core.

* * * * *